United States Patent
Sakui et al.

(10) Patent No.: US 9,972,391 B2
(45) Date of Patent: May 15, 2018

(54) APPARATUS, SYSTEMS, AND METHODS TO OPERATE A MEMORY

(71) Applicant: Micron Technology, Inc., Boise, ID (US)

(72) Inventors: Koji Sakui, Setagayaku (JP); Takehiro Hasegawa, Yokohama (JP); Mark Helm, Santa Cruz, CA (US)

(73) Assignee: Micron Technology, Inc., Boise, ID (US)

(*) Notice: Subject to any disclaimer, the term of this patent is extended or adjusted under 35 U.S.C. 154(b) by 0 days. days.

(21) Appl. No.: 14/971,634

(22) Filed: Dec. 16, 2015

(65) Prior Publication Data

US 2016/0180934 A1    Jun. 23, 2016

Related U.S. Application Data

(60) Provisional application No. 62/093,270, filed on Dec. 17, 2014.

(51) Int. Cl.
  *G11C 16/04* (2006.01)
  *G11C 16/26* (2006.01)
  *G11C 16/10* (2006.01)
  *G11C 16/24* (2006.01)
  *G11C 16/34* (2006.01)

(52) U.S. Cl.
  CPC .......... *G11C 16/0483* (2013.01); *G11C 16/10* (2013.01); *G11C 16/24* (2013.01); *G11C 16/26* (2013.01); *G11C 16/3427* (2013.01); *G11C 16/3459* (2013.01)

(58) Field of Classification Search
  None
  See application file for complete search history.

(56) References Cited

U.S. PATENT DOCUMENTS

| | | | | |
|---|---|---|---|---|
| 6,980,471 B1* | 12/2005 | Samachisa | ............. | G11C 16/10 |
| | | | | 365/185.02 |
| 2005/0056869 A1* | 3/2005 | Ichige | ................ | G11C 16/0483 |
| | | | | 257/222 |
| 2013/0279251 A1* | 10/2013 | Lee | ......................... | G11C 16/26 |
| | | | | 365/185.03 |
| 2015/0009756 A1* | 1/2015 | D'Alessandro | ........ | G11C 16/26 |
| | | | | 365/185.17 |

OTHER PUBLICATIONS

Taeuchi, Ken, et al., "A Source-Line Programming Scheme for Low-Voltage Operation NAND Flash Memories", IEEE Journal of Solid-State Circuits, vol. 35, No. 5,, (May 2000), 672-681.

Takeuchi, Ken, et al., "A Source-line Programming Scheme for Low Voltage Operation NAND Flash Memories", Symposium on VLSI Circuits Digest of Technical Papers 4-930813-95-6/99, (1999), 37-38.

\* cited by examiner

*Primary Examiner* — James G Norman
(74) *Attorney, Agent, or Firm* — Schwegman Lundberg & Woessner, P.A.

(57) ABSTRACT

Various embodiments, disclosed herein, include apparatus and methods to read a logic level in a selected memory cell in a selected string of a memory by sensing the logic level in response to a read current flowing through the selected string to a data line. Additional apparatus, systems, and methods are disclosed.

26 Claims, 13 Drawing Sheets

APPARATUS, SYSTEMS, AND METHODS TO OPERATE A MEMORY

PRIORITY APPLICATION

This application claims the benefit of priority to U.S. Provisional Application Ser. No. 62/093,270, filed Dec. 17, 2014, which is incorporated herein by reference in its entirety.

BACKGROUND

A memory block of a memory device, such as a NAND memory, may comprise a group of strings of charge storage devices that share the same set of access lines. The memory block may be grouped into a plurality of pages, and each page may comprise all or a subset of the charge storage devices corresponding to a respective tier of each of the group of strings, for example, depending on whether the charge storage devices are single-level cells or multi-level cells.

Under existing semiconductor memory techniques, a memory operation may be performed on an entire memory block (e.g., if the memory operation is an erase), or on a page within the memory block (e.g., if the memory operation is a program, read or verify). Accordingly, as the page size becomes larger, the power used during a data line swing or page buffer flip may increase, so that a relatively large amount of power may be consumed when relatively small amounts of data, such as 4 KB, are read, programmed, erased or verified. This tendency may be enhanced when an ABL (all-bit line) architecture is used, in comparison with a SBL (shielded bit line) architecture. Thus, as the size of the memory block or page increases, so does the current consumption and/or parasitic current leakage when memory operations are performed.

Problems may be aggravated in three-dimensional (3D) memory devices. For example, in a 3D memory device having strings of memory cells, wiring for a plurality of control gates (CGs) or source select gates (SGSs) of the strings may be physically merged into what is herein sometimes referred to as a "plate" that may comprise a plurality of horizontal CGs or SGSs, such as 16 CGs or 16 SGSs merged together. Each string may be accessed by a drain select gate (SGD). While reducing the number of high-voltage driver transistors needed to bias the CGs or SGSs (or other elements in the 3D memory device) to a certain signal (e.g., voltage), this also increases the number of charge storage devices in the memory block or page on which the memory operation may be performed concurrently.

DETAILED DESCRIPTION

Figure 1:
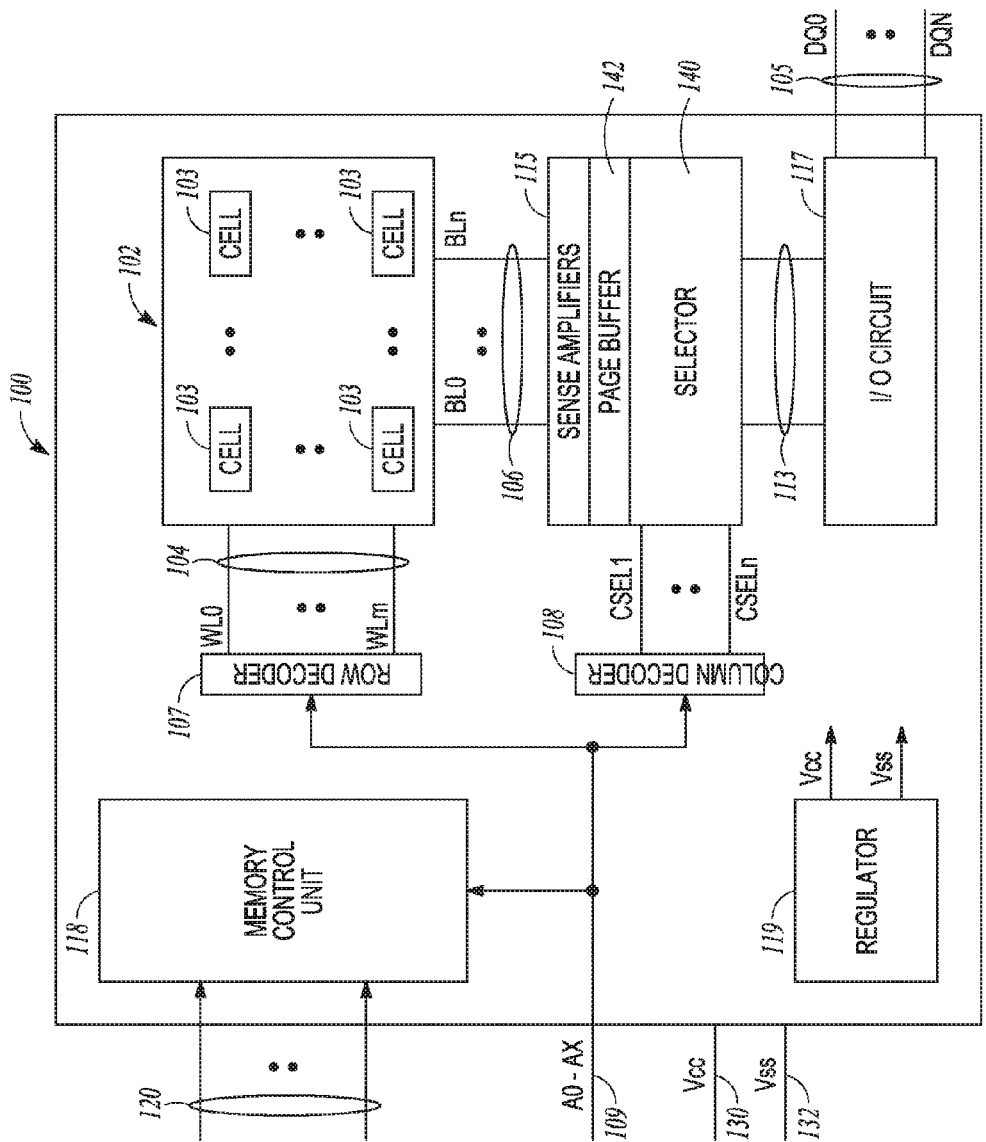
FIG. 1 shows a block diagram of a memory device having a memory array with memory cells, according to various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a common region to data line read in a memory block can be implemented to reduce read disturbance. The common region may be implemented as what is commonly referred to as a source line, though the source line is not limited to a line structure. For example, a source connection of one or more transistor(s) in a memory structure may be connected to a common voltage source. The common voltage source may be ground or other fixed voltage. Consider a control gate driver layout limitation of a conventional memory configuration, for an example, a configuration having a memory block with 16 pillars arranged as 16 strings with 32 tiers of memory cells with 16 control gates merged into one control gate plate providing a block size of 16 MB (16 word lines×32 Tiers×2 bits=1024 pages/block, block size=1024 pages×16 KB/page=16 MB). Only one of 1024 pages/block is selected to be read. Thereby, the unselected pages may suffer significantly from read disturbance because the SGS is common to the 16 pillars, and the unselected channels are forced to ground by the common region. Procedures and apparatus as taught herein can implement a common region to data line read that can provide reduced read disturbance.

In various embodiments, when conducting the common region to data line read, all the channels of the strings in a selected block can be initially precharged from the common region. Therefore, when the voltages to read and not read are applied to the appropriate CGs to read a memory cell in a selected string, all the channels of the unselected strings are boosted by the CG-to-channel capacitive coupling, because the unselected SGS transistors are automatically rendered non-conductive due to the precharging. Rendered non-conductive may also be referred to as cutoff and to render non-conductive may also be referred to as cuts off or cutting off. As a result, the read disturbance for the unselected strings can be drastically reduced. A voltage or signal to not read can be considered as a voltage or signal to pass on the read event for the particular memory cell and such a voltage, for example, can be referred to as a pass_read voltage, Vpass_read.

In various embodiments, an apparatus described herein may comprise a memory block that includes a plurality of strings of memory cells, with access lines and data lines shared by the strings. Each of the strings may comprise memory cells formed in a plurality of tiers. Each of the access lines may be coupled to the memory cells corresponding to a respective tier of the plurality of tiers. The memory cells corresponding to at least a portion of the respective tier may comprise a respective page of a plurality of pages of the memory block.

FIG. 1 shows a block diagram of an apparatus including a memory device 100. Memory device 100 includes a memory array 102 having a plurality of memory cells 103. Memory cells 103 can be arranged in rows and columns along with access lines 104 and first data lines 106. For example, the access lines may be word lines WL0 through WLm to conduct signals, and the first data lines may be bit lines BL0 through BLn to conduct signals. Memory device 100 can use access lines 104 and first data lines 106 to transfer data to and from memory cells 103. A row decoder 107 and a column decoder 108 decode address signals A0 through AX on address lines 109 to determine which ones of memory cells 103 are to be accessed.

Sense circuitry, such as a sense amplifier circuit 115, operates to determine the values of data read from memory cells 103 in the form of signals on the first data lines 106. Sense amplifier circuit 115 can also use the signals on the first data lines 106 to determine the values of data to be written to memory cells 103. In a common region to data line read operation of a memory cell in a selected string of memory cells, sense amplifier 115 can read a logic level in the selected memory cell in response to a read current flowing in the memory array through the selected string to the data line. The read current may flow from the common region. In an example, in which the data line is a bit line and the common region is a source line, the common region to data line read can be referred to as a source line to bit line (SLBL) read. The common region to data line read operation, in which read current flows from the common region to the data line is opposite to read current flow in a conventional memory device and read process.

Memory device 100 can include circuitry, such as an input/output (I/O) circuit 117, to transfer values of data between memory array 102 and I/O lines 105. Signals DQ0 through DQN on the I/O lines 105 can represent values of data read from or to be written into memory cells 103. I/O lines 105 can include nodes within memory device 100 (or alternatively, pins, solder balls, or other interconnect technologies such as controlled collapse chip connection (C4) or flip chip attach (FCA)) on a package where memory device 100 resides. Other devices external to memory device 100 can communicate with memory device 100 through I/O lines 105, address lines 109, or control lines 120. Examples of devices external to the memory device 100 can include, but is not limited to, a memory controller or a processor, not shown in FIG. 1.

Memory device 100 can perform memory operations, such as a read operation, to read values of data from selected ones of memory cells 103 and a programming operation (also referred to as a write operation) to program (e.g., to write) data into selected ones of memory cells 103. Memory device 100 can also perform a memory erase operation to clear data from some or all of memory cells 103.

A memory control unit 118 controls memory operations to be performed on memory cells 103 based on signals on the electrical state of signals on control lines 120. Examples of the signals on control lines 120 can include one or more clock signals and other signals to indicate which operation, for example, a programming or read operation, memory device 100 can or should perform. Other devices external to the memory device 100 can control the values of the control signals on control lines 120. Such external devices can include, but are not limited to, a processor or an external memory controller, for example. Specific combinations of values of the signals on control lines 120 can produce a command (e.g., a programming or read command) that can cause memory device 100 to perform a corresponding memory operation (e.g., a program, read, or erase operation).

Single-bit memory storage concepts as well as numerous multiple-bit schemes can be implemented based on the techniques taught herein. For example, each of memory cells 103 can be programmed to a different one of at least two data states to represent, for example, a value of a fractional bit, the value of a single bit or the value of multiple bits such as two, three, four, or more numbers of bits. For example, each of memory cells 103 can be programmed to one of two data states to represent a binary value of "0" or "1" in a single bit. Such a cell is sometimes called a single-level cell (SLC). In another example, each of memory cells 103 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC).

Memory device 100 can receive a supply voltage, including supply voltage signals Vcc and Vss, on a first supply line 130 and a second supply line 132, respectively. Typically, Vcc is greater than Vss. Supply voltage signal Vss may, for example, be at a ground potential (e.g., having a value of approximately zero volts). Supply voltage signal Vcc can include an external voltage supplied to memory device 100 from an external power source such as a battery or alternating-current to direct-current (AC-DC) converter circuitry (not shown in FIG. 1). Memory device 100 may include a regulator 119 to internally provide a Vcc and a Vss.

Memory device 100 can include a selector (e.g., a select circuit) 140, a page buffer 142, and an input/output (I/O) circuit 117. Page buffer 142 may store data received from an external device, such as a host, before it is programmed into a relevant portion (e.g., memory cells 103) of the memory array 102, or store data read from the memory array 102 before it is transmitted to the external device (e.g., the host). Selector 140 may be realized as a select circuit. Selector 140 can respond, to signals CSEL1 through CSELn to select data in the page buffer that can represent the values of data to be read from or to be programmed into memory cells 103. Second data lines 113 are used to transfer data from input/output (I/O) circuit 117 to page buffer 142 or vice versa.

Column decoder 108 can selectively activate the CSEL1 through CSELn signals based on the A0 through AX address signals on address lines 109.

Memory device 100 may comprise a non-volatile memory device and memory cells 103 can include non-volatile memory cells such that memory cells 103 can retain data stored therein when power (e.g., Vcc 130, Vss 132, or both) is disconnected from the memory device 100. Each of memory cells 103 can include a memory element having material, at least a portion of which can be programmed to a desired data state (e.g., by storing a corresponding amount of charge on a charge storage structure, such as a floating gate or charge trap, or by being programmed to a corresponding resistance value). Different data states can thus represent different values of data programmed into each of memory cells 103.

Memory device 100 can perform a programming operation when it receives a programming command and a value of data to be programmed into one or more selected ones of memory cells 103. The programming command may be received from an external processor or a memory controller. Based on the value of the data, the memory device 100 can program the selected memory cells to appropriate data states to represent the values of the data to be stored therein.

One of ordinary skill in the art may recognize that memory device 100 may include other components. However, several of these components are not necessarily shown in the figures, so as not to obscure the various embodiments described herein. Memory device 100 may include devices and memory cells, and operate using memory operations similar to or identical to those described below with reference to various other figures and embodiments discussed herein. Such memory operations may include, but are not limited to, read operations.

Figure 2:
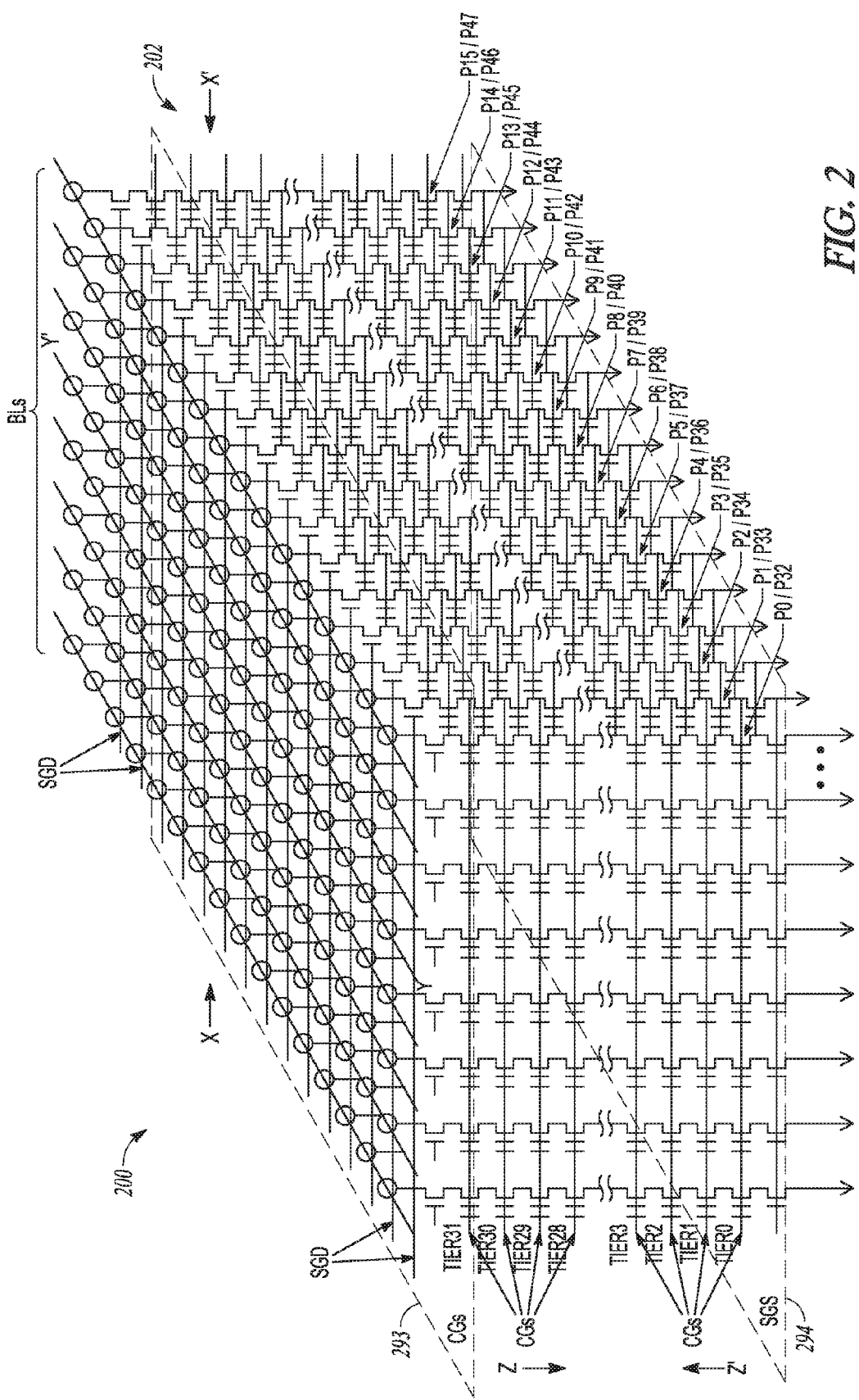
FIG. 2 shows a schematic diagram of a block architecture and page address mapping of a memory array, according to various embodiments.

FIG. 2 shows a schematic diagram of a block architecture and page address mapping of a memory array 202 of a memory device 200, according to various embodiments. Memory device 200 can be realized in the form of a 3D NAND memory device 200. Memory device 200 and memory array 202 may be similar to or identical to memory device 100 and memory array 102 of FIG. 1 in accordance with the teaching herein. Memory device 200 can comprise a plurality of strings of charge storage devices. In the Z-Z' direction shown in FIG. 2, each string of charge storage devices can comprise a plurality of storage devices stacked over one another with each charge storage device corresponding to one of a plurality of tiers. For example, as shown in FIG. 2, thirty-two charge storage devices are stacked over one another in a string with each charge storage device corresponding to one of thirty-two tiers shown as Tier0-Tier31. The number of storage devices and tiers in the Z direction are not limited to thirty-two. The charge storage devices of a respective string may share a common channel region, such as one formed in a respective pillar of semiconductor material (e.g., polysilicon) about which the string of charge storage devices are formed. The pillars may be polysilicon, monocrystalline silicon, or other semiconductor structure in which transistors can be fabricated.

In the X-X' direction shown in FIG. 2, sixteen groups of strings may comprise eight strings that share thirty two access lines. Each of the access lines may couple (e.g., electrically or otherwise operatively connect) the charge storage devices corresponding to a respective tier of each string of a corresponding one of the eight strings. The charge storage devices coupled by the same access line (and thus corresponding to the same tier) may be logically grouped into, for example, two pages, such as P0/P32, P1/P33, P2/P34 and so on, when each charge storage device comprise a multi-level cell capable of storing two bits of information. The page address mapping counts up horizontally in the same Tier.

In the Y-Y' direction shown in FIG. 2, eight groups of strings can comprise sixteen strings coupled to a corresponding one of eight data lines (BLs). The structure with respect to the SGSs in this example is one plate 294, which connects 16 pillar strings together, and the structure with respect to the CGs is one plate 293, which connects 16 pillar strings together. The SGD is separated by one pillar string. The number of the strings, tiers, access lines, data lines, groups of strings in each direction, and/or pages may be greater or smaller than those shown in FIG. 2.

Figure 3:
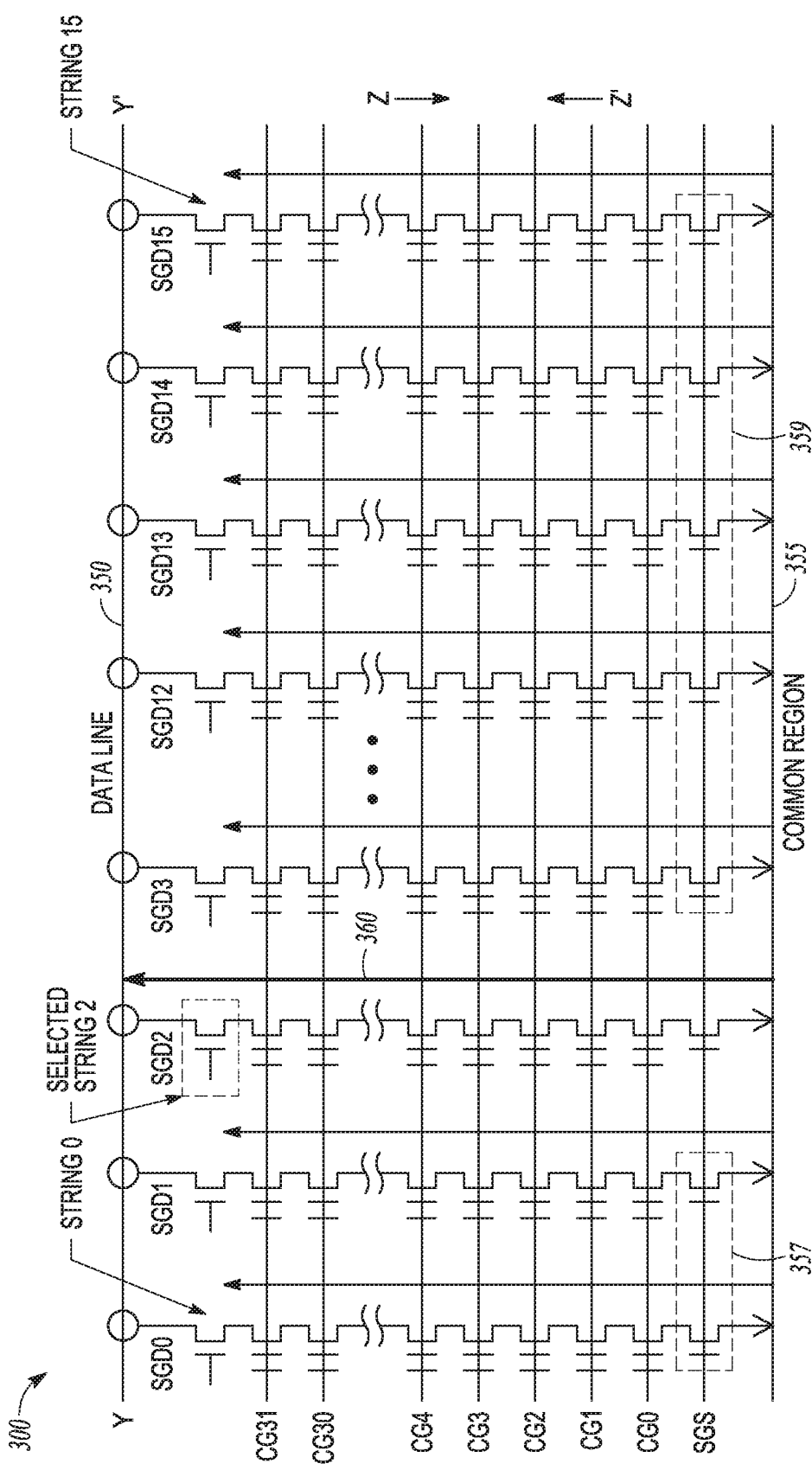
FIG. 3 illustrates a common region to data line read scheme with respect to a cross sectional view of a memory block of the memory device of FIG. 2 in a Y-Y' direction, according to various embodiments.

FIG. 3 illustrates a common region to data line read scheme with respect to a cross sectional view of a memory block 300 of memory device 200 of FIG. 2 in the Y-Y' direction, according to various embodiments. Memory block 300 can comprise a plurality of strings of charge storage devices that are coupled to the same data line and correspond to one of a group of strings in the Y-Y' direction. In the example of FIG. 3, memory block 300 includes 16 strings coupled to data line 350 that corresponds to one of the eight groups of strings in the Y-Y' direction shown in FIG. 2. As noted with respect to FIG. 2, each charge storage device of a respective tier may be coupled to the same plate; one of plates CG0-CG31. Similarly, the sixteen SGSs of the sixteen strings may be coupled to the same SGS plate. Each of the SGDs, SGD0-SGD15, of the sixteen strings may be separated from one another, which provides a mechanism to select one of the sixteen strings SGD0-SGD15. In various embodiments, the plurality of strings may be coupled to a common region 355 that is shared.

As shown in FIG. 3 as an example of a common region to data line read, string 2 of the selected block 300 is selected via SGD02 to read a memory cell in selected string 2. For a common region to data line read, all the channels of the strings in the selected block 300 can be initially precharged from common region 355, that is, each of string0 . . . string15 can be initially precharged from common region 355. In this precharge, a voltage is applied to common region 355 and SGSs that is greater than the voltage applied to data line 350. In addition, a voltage can be applied to the selected CG and the unselected CGs that is greater than the voltage applied to the data line.

In a boot-strap procedure, a boosting node should be sufficiently precharged, the boosting node can be made Hi-Z by disconnecting the input and output transistors for the boosting node, and a kick-voltage may be maximized for the boosting node. Following a sufficient precharge, a read voltage, Vread, is applied to the selected CG and a Vpass_read is applied to the unselected CGs at which time the channels of the unselected strings are boosted by its respective CG-to-channel capacitive coupling, because unselected SGS transistors 357 and SGS transistors 359 are automatically rendered non-conductive, based on the precharge and applied gate voltage. If the precharge is insufficient, following the precharge, a read voltage, Vread, is applied to the selected CG and a Vpass_read is applied to the unselected CGs at which time the channels of the unselected strings are boosted by its respective CG-to-channel capacitive coupling, and unselected SGS transistors 357 and SGS transistors 359 are automatically rendered non-conductive, based on the precharge and applied gate voltage. As a result, the read disturbance for the unselected strings (String0, String1, and String3-String15) can be drastically reduced. As shown in FIG. 3, current 360 flows in selected string2 from common region 355 to data line 350 with unselected SGS transistors 357 and 359 being automatically rendered non-conductive when Vpass_read and Vread voltages are applied to the appropriate CGs.

Figure 4:
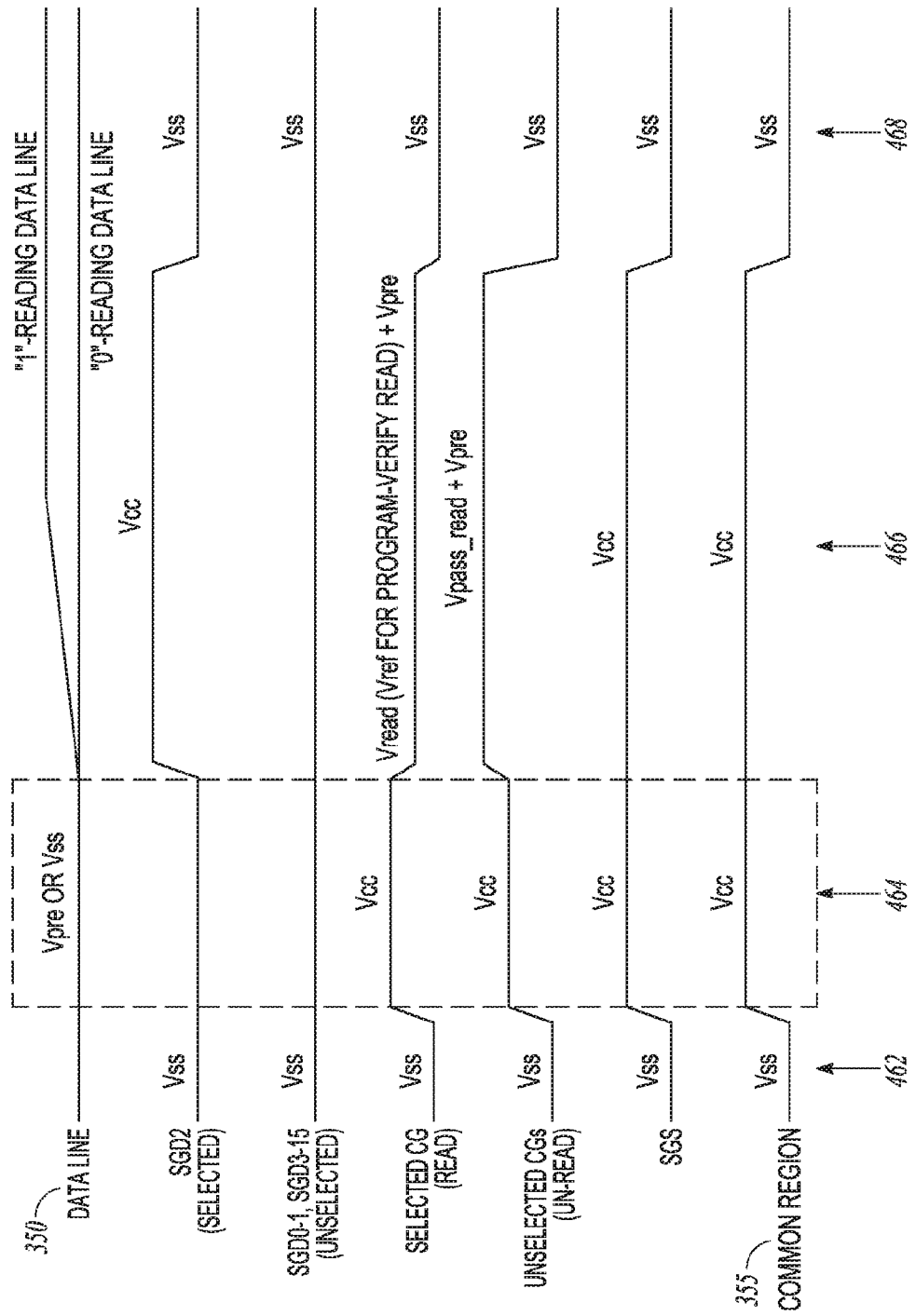
FIG. 4 illustrates read and program-verify read waveforms with respect to the example scheme in FIG. 3, according to various embodiments.

FIG. 4 illustrates read and program-verify read waveforms with respect to the example scheme in FIG. 3. In FIG. 4, four time intervals are shown: an interval 462 before precharging, a precharge interval 464, a read interval 466, and a post read interval 468. At interval 462 before a memory cell and corresponding string are selected to read, voltage applied to the SGD0-SGD15 can be set to a low value such that none of corresponding strings, String0-String15, are selected. In addition, a low value, which may be the same as applied to SGD0-SGD15, is applied to CG0-CG31, and a low value, which may be the same as applied to SGD0-SGD15, is applied to common region 355 and the coupling SGSs to common region 355. This low value may be Vss. Vss may be a source voltage interior to memory device 200. Data line 350 is set to Vss or a precharge voltage Vpre.

At precharge interval 464, all the pillar channels of the selected block 300 can be precharged from common region 355. In the precharge, the voltage applied to the SGD0-SGD15 remains set to a low value such as Vss and the voltage at data line 350 remains set to a low value such as Vss or Vpre. In the precharge, the voltages at the selected CG and the unselected CGs, common region 355 and the coupling SGS is raised to a higher level such as Vcc.

In the read interval 466, with SGS and common region 355 set to Vcc, when a Vpass_read is applied to the unselected CGs and a Vread voltage is applied to the selected CG, the SGS transistors 357 and 359 of the unselected strings are automatically rendered non-conductive and the channels of the unselected strings are boosted by the CG-channel capacitive coupling. As a result, the read disturbance of the unselected strings can be drastically reduced. The waveform at the selected CG can be at a level of Vread, which can be at a reference voltage, Vref, for program-verify read, plus Vpre that may be applied to data line 350 during precharge. The waveform at the unselected CGs can be at a level of Vpass_read plus Vpre. Data line 350 can raises in voltage in reading a "1" and remain at the precharge level in reading a "0," which opposite to conventional reads. At the post read interval 468, data line can remain at the level of reading, while the SGD0-SGD15, CG0-CG31, common region 355 and the SGSs at placed at the low value such as Vss.

Since in the common region to data line read, the data line voltages are opposite to the logical "1" and "0" voltage level of a conventional read, the logic level of the sense amplifiers can be adjusted to be opposite those of sense amplifiers in a conventional read. Also, the CGs voltages of Vpass_read and Vread should be shifted positively by the data line precharge level of Vpre. As for the ABL sensing scheme, the load transistor of data line can be a NMOS transistor, rather than a PMOS transistor of the conventional architecture, which can allow the cell current to be grounded.

Figure 5A:
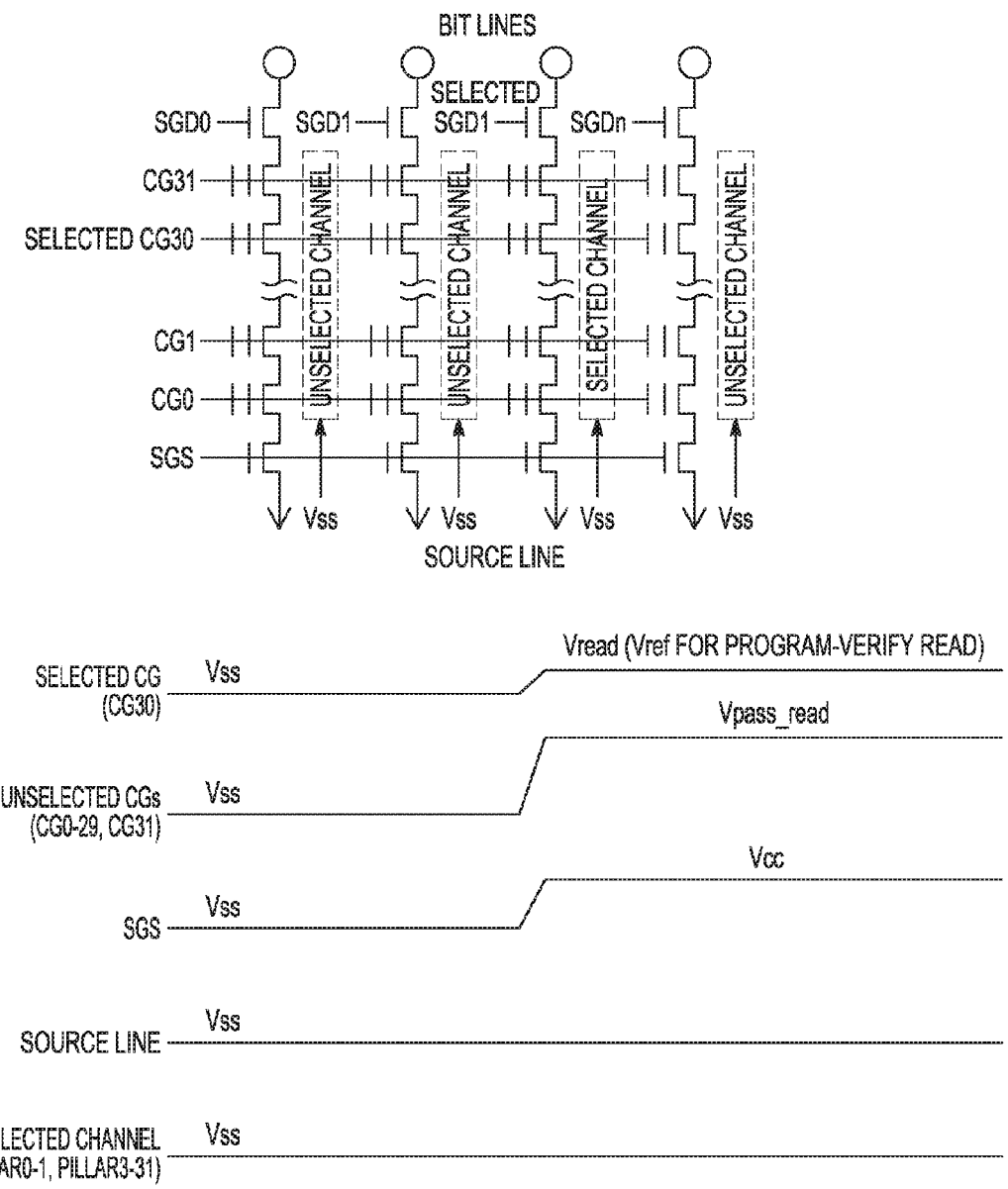
FIGS. 5A and 5B illustrate the differences between a conventional read for a bit line and a common region to data line read, according to various embodiments.
Figure 5B:
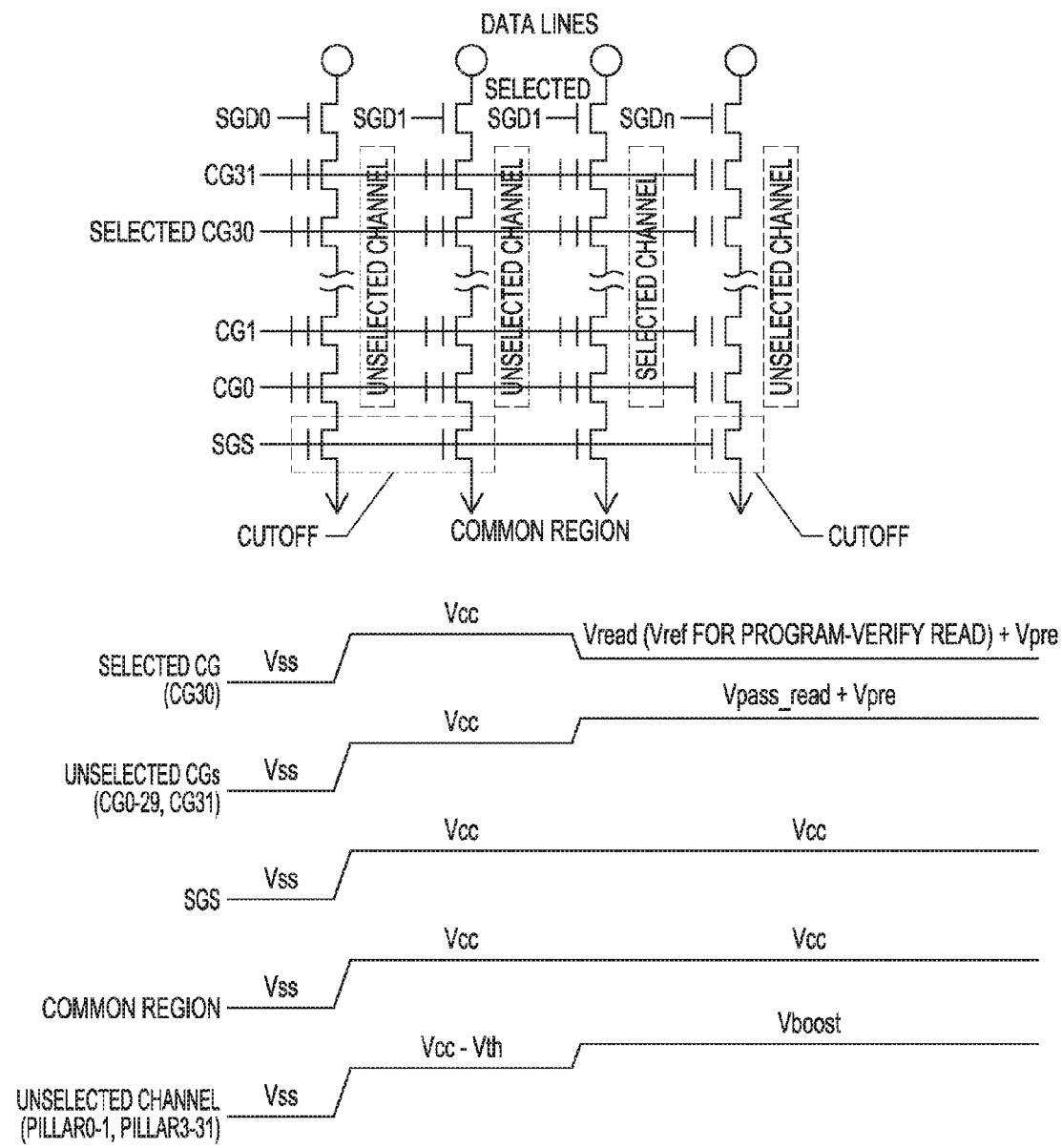

FIGS. 5A and 5B illustrate the differences between a conventional read in FIG. 5A for a bit line and a common region to data line read in FIG. 5B with the data line as a bit line. In the conventional read scheme of FIG. 5A, the channels of the unselected strings are set to the level of the source line, Vss, where the voltage level of these channels remains at Vss, even with the application of the Vpass_read signal. In the common region to data line read in FIG. 5B, the unselected strings to the common region are rendered non-conductive with the application of Vcc to the a common region such that the voltage level of these channels rises to Vcc minus the transistor threshold voltage, Vth and further raised upon application of the Vpass_read signal to a boosted level, Vboost.

Figure 6:
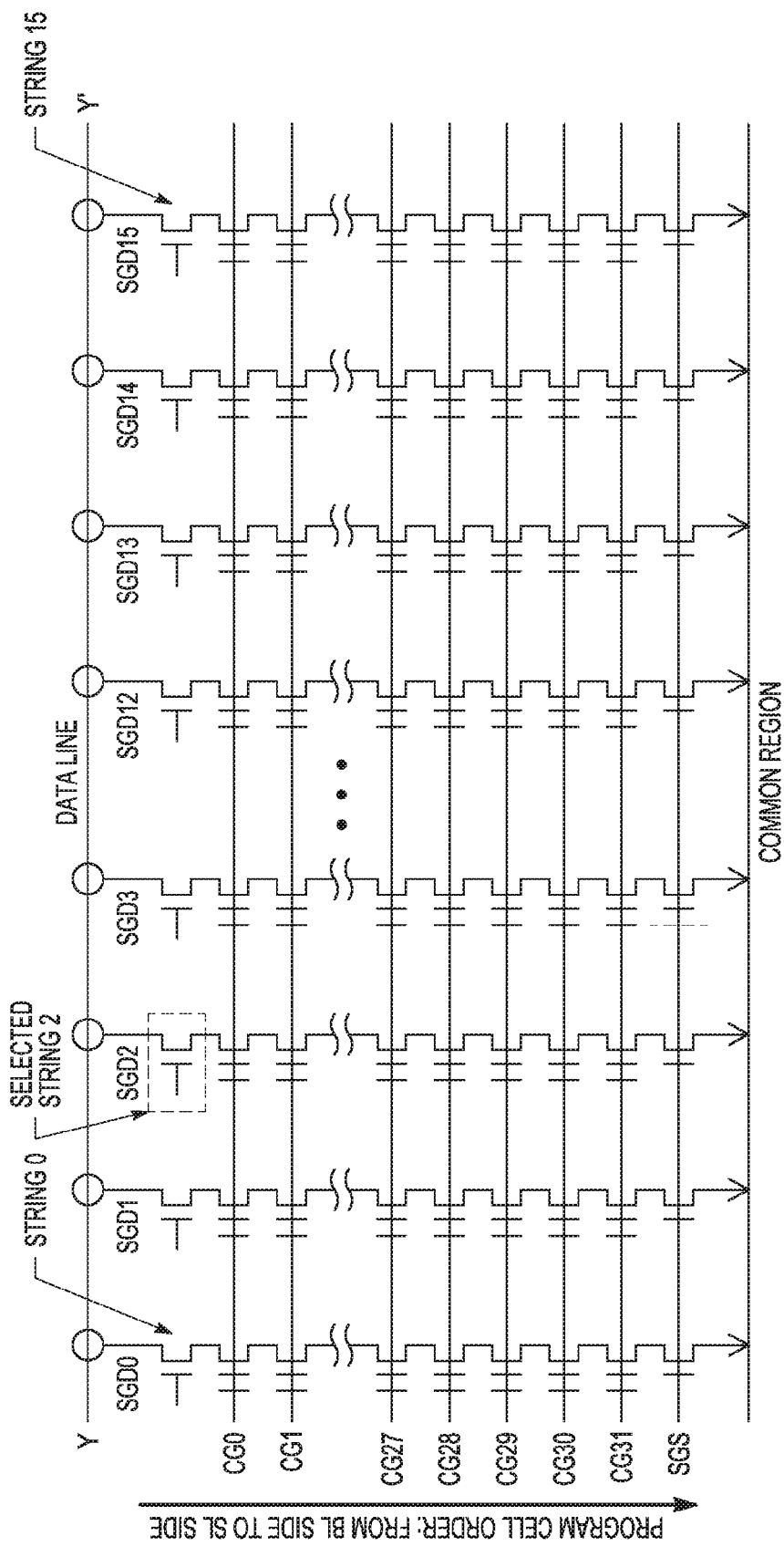
FIG. 6 shows a program cell order from a data line to a common region scheme, according to various embodiments.

FIG. 6 shows a program cell order from a data line to a common region scheme. To overcome the data pattern influence of the common region to data line read scheme, the program cell order, such as from the data line side cell to the common region side cell, can also be reversed from the conventional order. In this case, the CGs of those cells are already programmed should be higher than others before the actual program pulse, so that the channels will be sufficiently precharged. However, with respect to a local self boost (LSB) scheme, the cut-off characteristics of the already programmed data line side cells may be somewhat degraded as a trade-off.

Figure 7A:
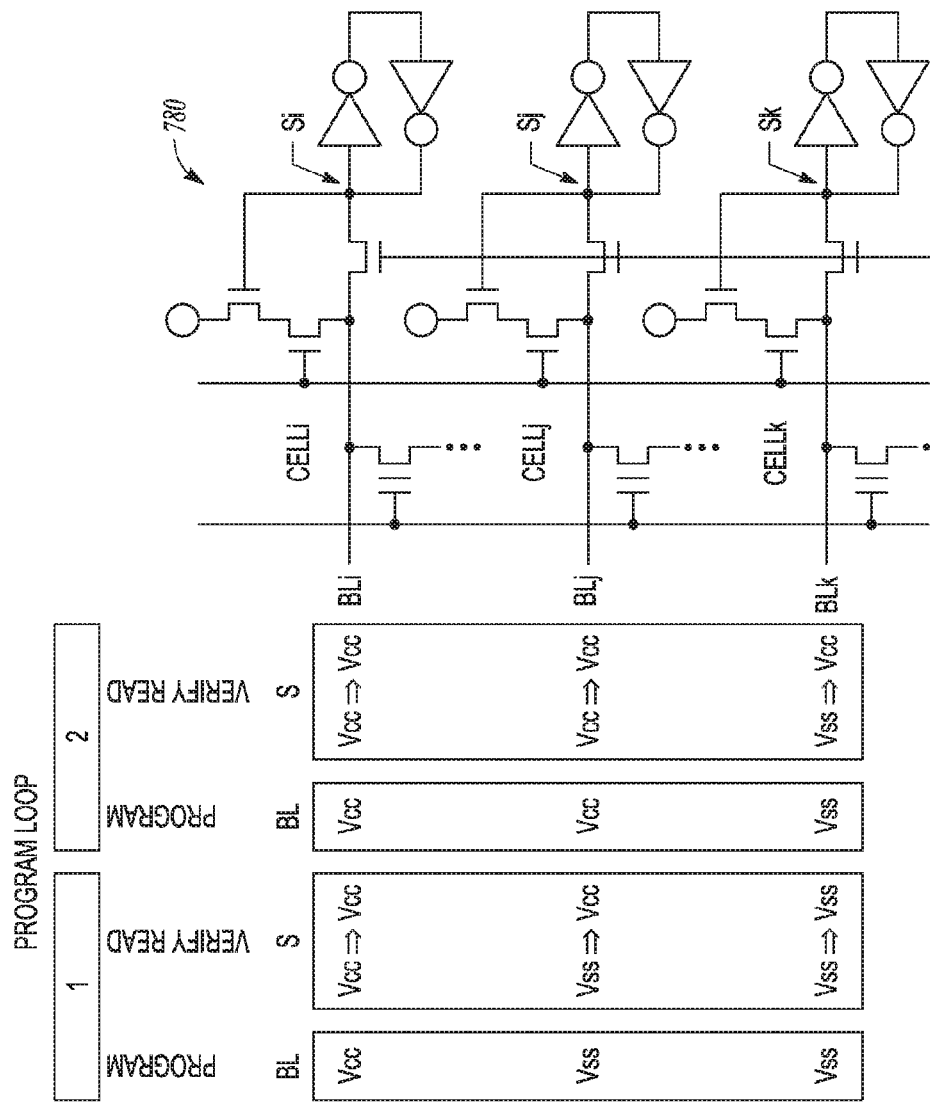
FIGS. 7A-7B illustrate differences in a bit-by-bit verify circuit between a conventional architecture using a conventional read and an architecture associated with a common region to data line read, according to various embodiments.
Figure 7B:
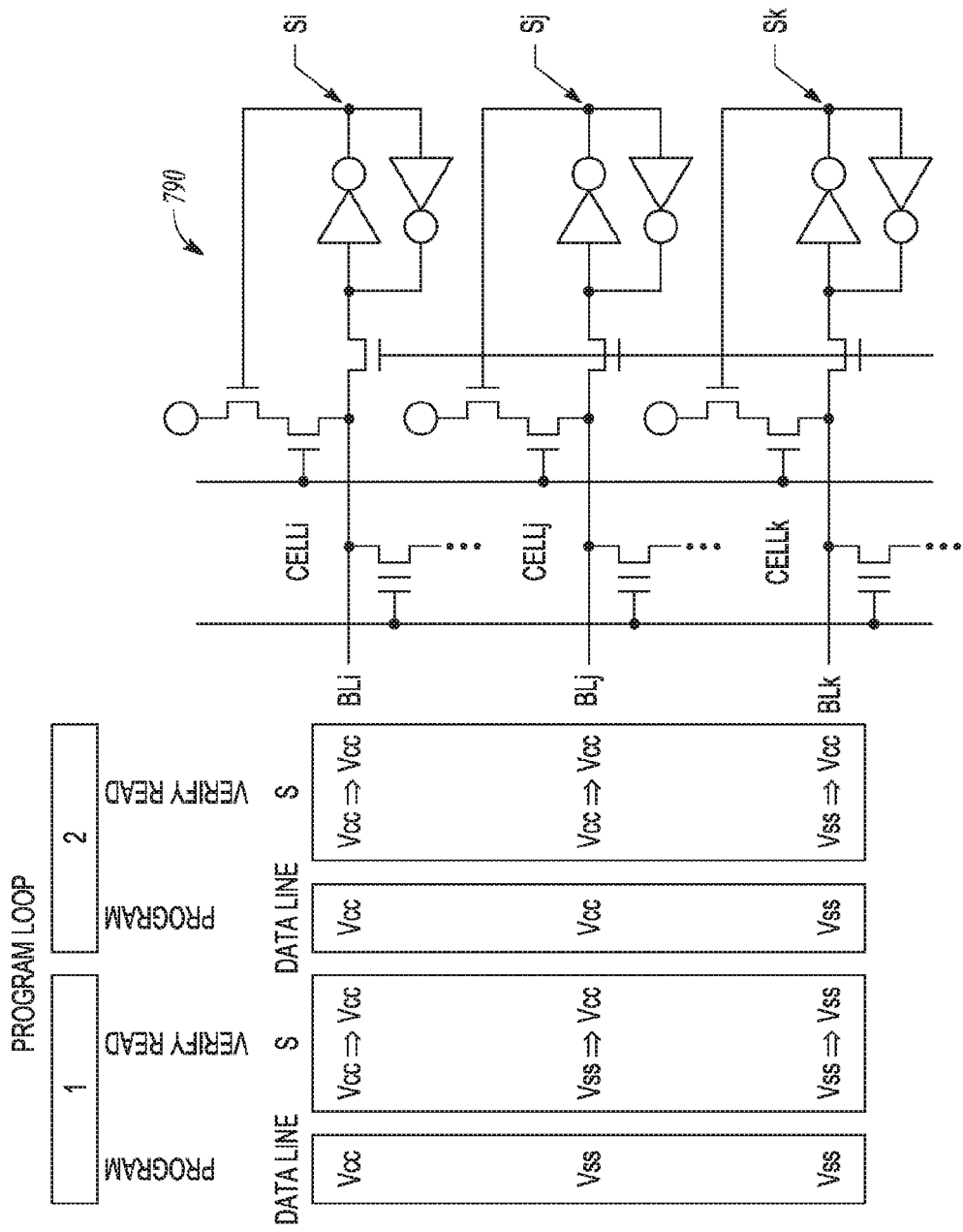

FIGS. 7A-7B illustrate differences in a bit-by-bit verify circuit between a conventional architecture using a conventional read and an architecture associated with a common region to data line read. FIG. 7A shows a conventional bit-by-bit verify scheme 780 according to a page of load data. If the memory cell, Cellj, is being programmed, the node of a page buffer, Sj, is set to the source voltage, Vss. After every programming operation, a verify read is performed by applying a reference voltage, Vref, to the wordline to verify whether the threshold voltage of the programming cell surpasses Vref or not. If the threshold voltage of Cellj exceeds Vref in the 1st programming cycle, the voltage of Sj is charged up to Vcc from Vss by the load transistor so that the page buffer is flipped, and then Cellj is not programmed after that. Once the voltage of Sj becomes Vcc, the page buffer cannot be flipped back even though the bitline voltage of Cellj is discharged down to Vss from Vcc in the next verify read operation. Conversely, Sk for the non-programming cell is set to the power supply voltage, Vcc, and keeps this voltage level. When every voltage of S in the page buffers eventually becomes Vcc, the program operation is stopped. When all the S nodes of Si, Sj, and Sk become Vcc after a verify read, the program is completed. Here, Celli keeps the erased state, so that Si is originally Vcc. Conversely, Cellj and Cellk are to be programmed, so that Sj and Sk are Vss in the beginning.

FIG. 7B shows a bit-by-bit verify scheme 790 for a common region to data line read architecture. In this scheme, the data line voltage becomes Vss+~Vcc, when the cell is in the erased state or insufficiently programmed, while the data line keeps Vss, when the cell with the fully programmed state is read or verify read. In this manner, the data line logic is reversed from that of the conventional scheme, when the cell is read or verify read. Therefore, the verify circuit connection to node S of the flip-flop should be also reversed for the common region to data line scheme relative to the conventional scheme. Note, in the conventional scheme of FIG. 7A, the input of the flip-flop at node S is connected to the load transistor, while, in the common region to data line read architecture, as shown in FIG. 7B, the output of the flip-flop at node S is connected to the load transistor.

Figure 8A:
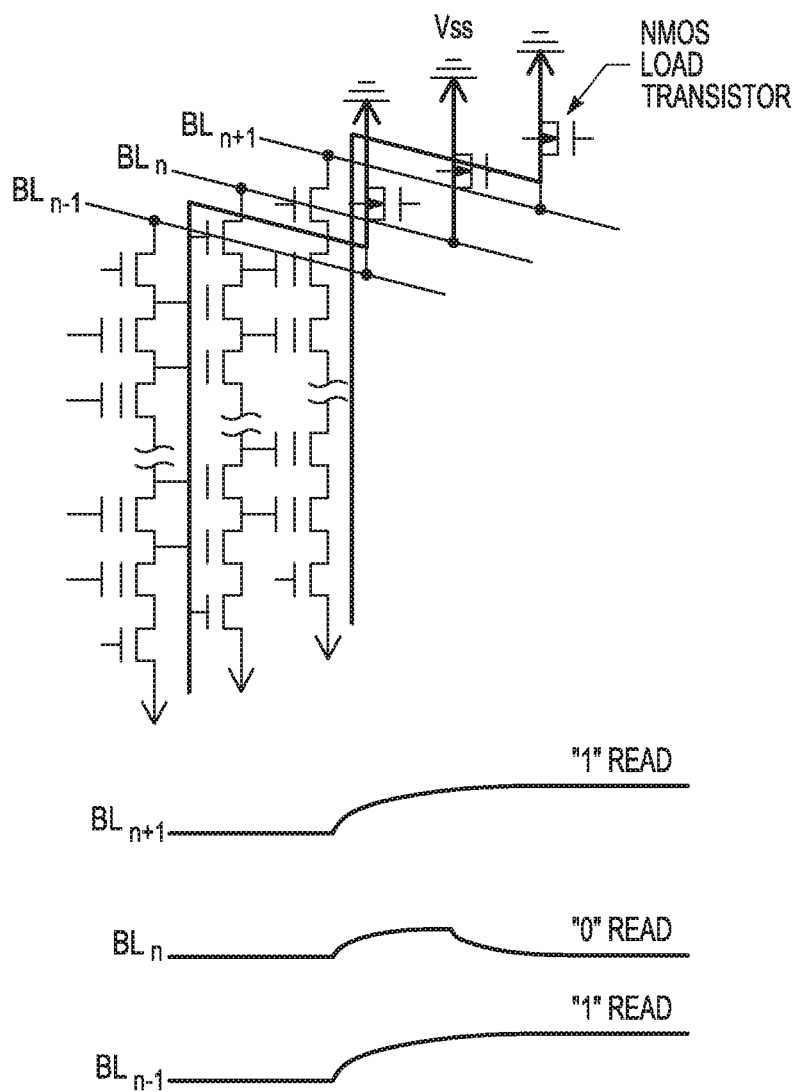
FIG. 8A illustrates features of an all bit line architecture, according to various embodiments.

FIG. 8A illustrates features of an ABL architecture. The data lines, in this example, comprise bit lines including $BL_{n-1}$, $BL_n$, $BL_{n+1}$ coupled to Vss by a NMOS load transistor. Vss may be ground. Also shown in FIG. 8A are voltage levels at $BL_{n-1}$, $BL_n$, $BL_{n+1}$ for reading a "1", a "0," and a "1," respectively, for the ABL architecture.

Figure 8B:
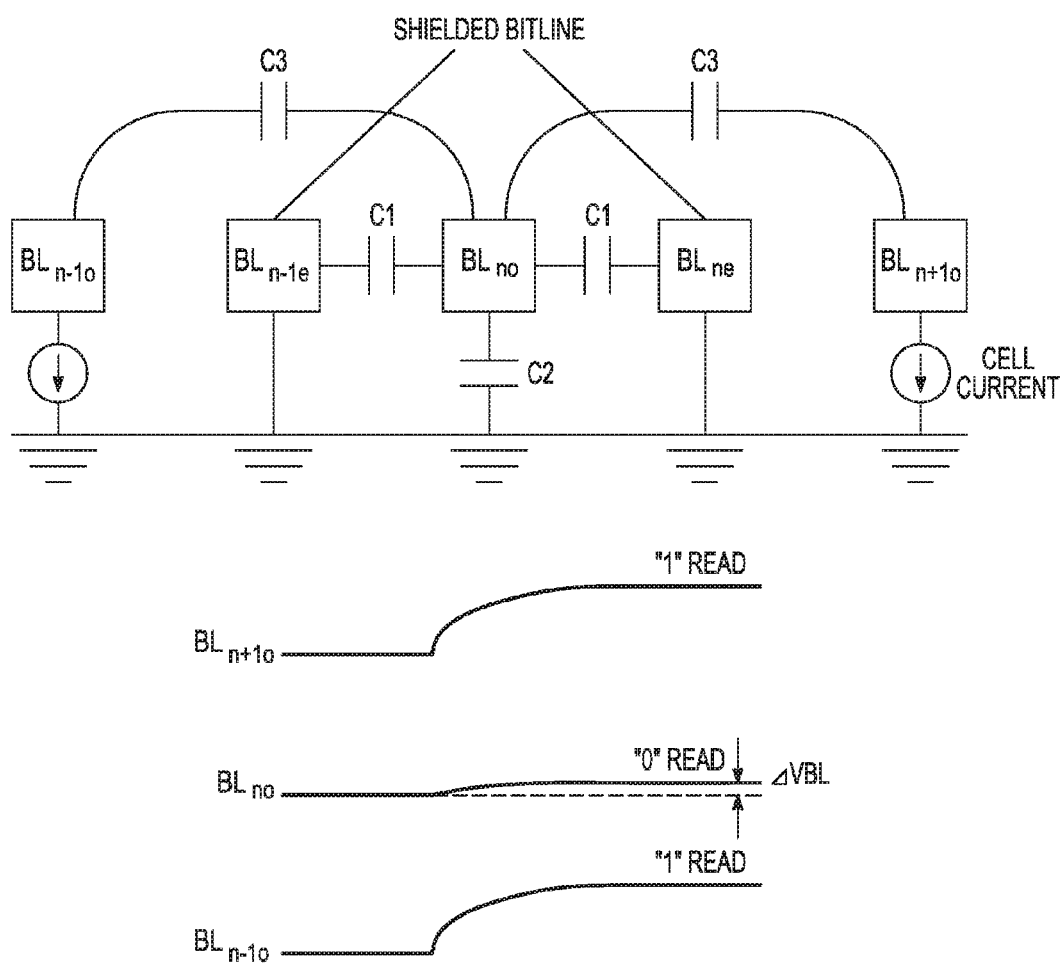
FIG. 8B illustrates features of a shielded bit line architecture, according to various embodiments.

FIG. 8B illustrates features of an SBL architecture. The data lines, in this example, comprise bit lines including $BL_{n-1O}$, $BL_{nO}$, $BL_{n+1O}$ with shielded bitline $BL_{n-1e}$ between $BL_{n-1O}$ and $BL_{nO}$ and shielded bitline $BL_{ne}$ between $BL_{nO}$ and $BL_{n+1O}$. Cell current may be directed from a bitline to ground. Also shown in FIG. 8B are voltage levels at $BL_{n-1O}$, $BL_{nO}$, $BL_{n+1O}$ for reading a "1", a "0," and a "1," respectively, for the ABL architecture.

Figure 9:
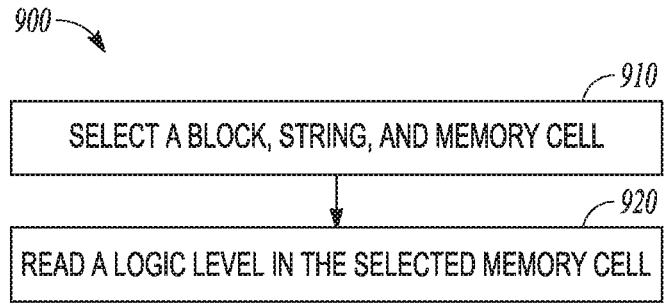
FIG. 9 shows features of an example method of operating a memory, according to various embodiments.

FIG. 9 shows features of an embodiment of an example method 900 of operating a memory. At 910, a block, string, and memory cell are selected. A selected block of a three-dimensional memory, a string of a plurality of strings in the selected block of the three-dimensional memory, and a memory cell of the selected string can be selected. At 920, a logic level in the selected memory cell is read. The logic level can be read by sensing the logic level in response to a read current flowing through the selected string to a data line. The read current may flow from a common region. The common region may be a source line, though such a source line is not limited to a line structure.

Method 900 or a method similar to method 900 can include precharging channels of each string of the plurality of strings in the selected block to read the logic level in the selected memory cell and, after precharging, applying read related signals such that a transistor, in each unselected string that couples the unselected string to the common region, is rendered non-conductive.

Method 900 or a method similar to method 900 can include using supply voltages Vcc and Vss, Vcc>Vss, in a precharging of the plurality of strings and in the reading of the logic level in the selected memory cell such that Vcc is applied to the common region during the precharging and during the reading, and Vss is applied to the common region after the reading.

Method 900 or a method similar to method 900 can include conducting a precharge followed by the reading of the logic level in the selected memory cell by applying a precharge voltage, Vpre, to the data line during the precharge and applying a supply voltage, Vcc, to the common region during the precharge, Vcc>Vpre.

Method 900 or a method similar to method 900 can include conducting operation of a memory having the plurality of strings equal 16 strings and having 32 tiers of control gate lines, each control gate line of each tier coupled to a respective control gate in each of the 16 strings.

Figure 10:
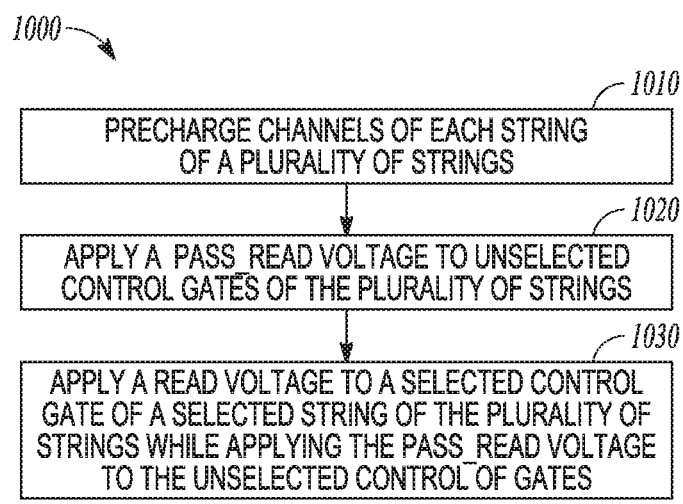
FIG. 10 shows features of an example method of operating a memory, according to various embodiments.

FIG. 10 shows features of an embodiment of an example method 1000 of operating a memory. At 1010, channels of each string of a plurality of strings are precharged. All channels of each string of a plurality of strings in a selected block of a three-dimensional memory can be precharged from a common region to each string of the plurality of strings. Precharging can include applying a voltage to the unselected control gates, the selected control gate, and the common region at a level greater than a voltage level applied to the data line for precharging. Applying the voltage to the unselected control gates, the selected control gate, and the common region can include applying supply voltage Vcc to the unselected control gates, the selected control gate, and the common region with supply voltage Vss or a precharge voltage applied to the data line, Vcc being greater than Vss and greater than the precharge voltage.

At 1020, a pass_read voltage is applied to unselected control gates of the plurality of strings. At 1030, a read voltage is applied to a selected control gate of a selected string of the plurality of strings while applying the pass_read voltage to the unselected control gates. The read voltage can be applied to the selected control gate of the selected string of the plurality of strings while applying the pass_read voltage to the unselected control gates such that voltage of channels of unselected strings are boosted and read current flows from the common region through channels of the selected string to a data line.

Method 1000 or a method similar to method 1000 can include reading a logic one at the data line having a voltage higher than voltage at the data line reading a logic zero. Method 1000 or a method similar to method 1000 can include programming memory cells of a string of the plurality of strings in a program cell order from the data line to the common region. Features of any methods or other combinations of features, as taught herein, may be combined into an appropriate procedure according to the teachings herein.

In various embodiments, a system can include a three-dimensional memory having a block of memory cells, a plurality of strings in the block arranged with each string of the plurality of strings coupled to a data line and to a common region, control circuitry to operatively apply read related signals to the plurality of strings, and a sense amplifier configured to read a logic level in the selected memory cell in response to a read current flowing from the common region through the selected string to the data line, with the memory having combinations of features as described herein. Different features presented herein may be used in a number of embodiments.

In various embodiments, a first apparatus can comprise a three-dimensional memory having a block of memory cells; a plurality of strings in the block arranged with each string of the plurality of strings coupled to a data line and to a common region, each string including a plurality of memory cell transistors, each memory cell transistor having a control gate and a channel, each string coupled to the data line individually by a select transistor and each string individually coupled to the common region by a source select transistor; control circuitry to operatively apply read related signals to the plurality of strings such that a string of the plurality of strings is operatively selected and a memory cell of the selected string is operatively selected to read the selected memory cell; and a sense amplifier configured to read a logic level in the selected memory cell in response to a read current flowing from the common region through the selected string to the data line. In the apparatus or similar apparatus, the control circuitry can be structured to operatively precharge channels of each string of the plurality of strings in the block to read the logic level in the selected memory cell and, after the precharge, to apply the read related signals such that the source select transistor in each unselected string is rendered non-conductive.

In the first apparatus or similar apparatus, control circuitry can be structured to apply a supply voltage Vcc to the common region during a precharge of the plurality of strings and during the read of the selected memory cell, and to apply a supply voltage Vss to the common region after the read, Vcc>Vss. The control circuitry can be structured to apply a precharge voltage, Vpre, to the data line during the precharge.

In the first apparatus or similar apparatus, the data line can be coupled to a low supply voltage, Vss, by an n-type metal oxide semiconductor load transistor.

In the first apparatus or similar apparatus, such apparatus can include a verify circuit for each memory cell, the verify circuit having a node at the output of a flip-flop coupled to a load transistor disposed in a path to the input of the flip-flop.

In various embodiments, a second apparatus can comprise a three-dimensional memory having a block of memory cells; a plurality of strings in the block arranged with each string of the plurality of strings coupled to a data line and to a common region, each string including a plurality of memory cell transistors, each memory cell transistor having a control gate and a channel, each string coupled to the data line individually by a select transistor and each string individually coupled to the common region by a source select transistor; control circuitry structured to operatively select a string of the plurality of strings and select a memory cell via the control gate of the selected memory cell in the selected string, to operatively precharge channels of each string of the plurality of strings in the block from the common region, to apply a pass_read voltage to unselected control gates of the plurality of strings, and to operatively apply a read voltage to the selected control gate during application of the pass_read voltage to the unselected control gates such that voltage of channels of unselected strings are boosted and read current flows from the common region through channels of the selected string to the data line; and a sense amplifier configured to read a logic level in the selected memory cell in response to the read current flowing from the common region through the selected string to the data line.

In the second apparatus or similar apparatus, the control circuitry can be structured to conduct the precharge by application of a voltage to the unselected control gates, the selected control gate, and the common region at a level greater than a voltage level applied to the data line in the precharge. The data line can be coupled to ground. The three-dimensional memory can be a three-dimensional NAND flash memory. In the second apparatus or similar apparatus, the control circuitry can include logic to program memory cells of a string of the plurality of strings in a program cell order from the data line to the common region.

In various embodiments, a wafer can comprise a plurality of dies, each die including: a three-dimensional memory having a block of memory cells; a plurality of strings in the block arranged with each string of the plurality of strings coupled to a data line and to a common region, each string including a plurality of memory cell transistors, each memory cell transistor having a control gate and a channel, each string coupled to the data line individually by a select transistor and each string individually coupled to the common region by a source select transistor; control circuitry to operatively apply read related signals to the plurality of strings such that a string of the plurality of strings is operatively selected and a memory cell of the selected string is operatively selected to read the selected memory cell; and a sense amplifier configured to read a logic level in the selected memory cell in response to a read current flowing from the common region through the selected string to the data line.

In various embodiments of the wafer, the control circuitry of each die can be structured to operatively precharge channels of each string of the plurality of strings in the block to read the logic level in the selected memory cell and, after the precharge, to apply the read related signals such that the source select transistor in each unselected string is rendered non-conductive.

In various embodiments of the wafer, the control circuitry of each die can be structured to apply a first voltage to the common region during a precharge of the plurality of strings and during the read of the selected memory cell, and to apply a precharge voltage to the data line during the precharge, the first voltage greater than the precharge voltage.

In various embodiments of the wafer, the data line of each die is coupled, by an n-type metal oxide semiconductor load transistor, to a node that operatively receives a low supply voltage, Vss.

In various embodiments of the wafer, the control circuitry of each die includes logic to program memory cells of a string of the plurality of strings in a program cell order from the data line to the common region.

Features of any of the permutations of systems, wafers, or other combinations of features, as taught herein, may be combined into a system or wafer according to the teachings herein.

Figure 11:
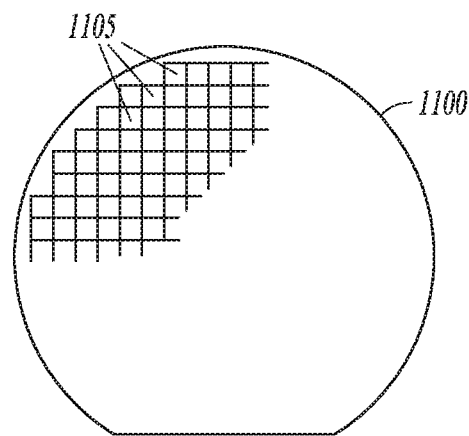
FIG. 11 illustrates an example of a wafer arranged to provide multiple electronic components including a memory having an architecture to conduct a common region to data line read, according to various embodiments.

FIG. 11 illustrates an example of a wafer 1100 arranged to provide multiple electronic components. Wafer 1100 can be provided as a wafer in which a plurality of dice 1105 can be fabricated. Alternatively, wafer 1100 can be provided as a wafer in which the plurality of dice 1105 have been processed to provide electronic functionality and are awaiting singulation from wafer 1100 for packaging. Wafer 1100 can be provided as a semiconductor wafer, a semiconductor on insulator wafer, or other appropriate wafer for processing electronic devices such as an integrated circuit chips. Wafer 1100 can be fabricated in accordance with any embodiment related to FIGS. 1-10.

Using various masking and processing techniques, each die 1105 can be processed to include functional circuitry such that each die 1105 is fabricated as an integrated circuit with the same functionality and packaged structure as the other dice on wafer 1100. Alternatively, using various masking and processing techniques, various sets of dice 1105 can be processed to include functional circuitry such that not all of the dice 1105 are fabricated as an integrated circuit with the same functionality and packaged structure as the other dice on wafer 1100. A packaged die having circuits integrated thereon providing electronic capabilities is herein referred to as an integrated circuit (IC).

Wafer 1100 can include memories, where each memory is located in a die 1105. The memory may be structured as a 3D memory having a plurality of memory cells disposed in a plurality of strings using conventional fabrication technologies and procedures. Various components in the memories may be modified to provide control signals to implement a common region to data line read and other components can be modified to sense current flow from the common region to the data line, associated with any of FIGS. 1-12 as taught herein.

Figure 12:
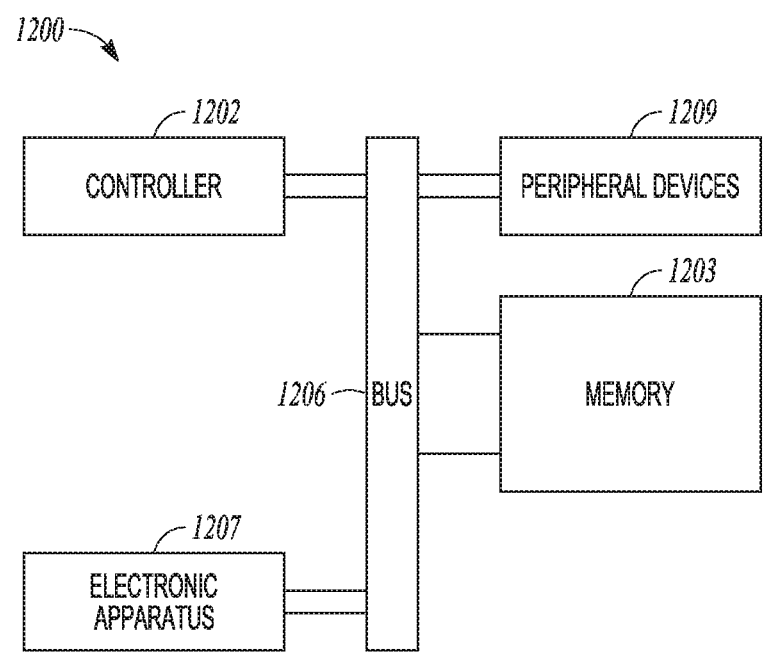
FIG. 12 shows a block diagram of a system that includes a memory structured to conduct common region to data line read operations, according to various embodiments

FIG. 12 shows a block diagram of a system 1200 that includes a memory 1203 structured to conduct common region to data line read operations. Memory can be a realized as a 3D NAND memory. The device architectures of memory 1203 having a plurality of strings and a plurality of memory cells per string can be realized in a manner similar to or identical to structures in accordance with various embodiments discussed herein.

System 1200 can include a controller 1202 operatively coupled to memory 1203. System 1200 can also include an electronic apparatus 1207 and peripheral devices 1209. One or more of controller 1202, memory 1203, electronic apparatus 1207, and peripheral devices 1209 can be in the form of one or more ICs. A bus 1206 provides electrical conductivity between and/or among various components of system 1200. In an embodiment, bus 1206 includes an address bus, a data bus, and a control bus, each independently configured. In an alternative embodiment, bus 1206 uses common conductive lines for providing one or more of address, data, or control, the use of which is regulated by controller 1202. Controller 1202 can be in the form or one or more processors.

Electronic apparatus 1207 may include additional memory. Memory in system 1200 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 1209 may include displays, imaging devices, printing devices, wireless devices, additional storage memory, and control devices that may operate in conjunction with controller 1202. In various embodiments, system 1200 includes, but is not limited to, fiber optic systems or devices, electro-optic systems or devices, optical systems or devices, imaging systems or devices, and information handling systems or devices such as wireless systems or devices, telecommunication systems or devices, and computers.

In various embodiments, in a common region to data line read in a 3D memory having memory cells disposed in strings, all the pillar channels of a selected block of memory can be precharged from the common region of the memory, such that when Vpass_read and Vread voltages are applied to the CGs, the SGS transistors of unselected strings are automatically rendered non-conductive and all the channels of the unselected strings are boosted by the CG-channel capacitive coupling. The CGs voltages of Vpass_read and Vread can be shifted positively by the BL precharge level of Vpre. As a result, read disturbance of the unselected strings can be drastically reduced. In the example case, where 16 CGs are merged into one plate, the read disturbance is reduced to about $1/16$ of the read disturbance associated with a conventional memory architecture and read. The common region may be implemented as a source line, though the source line is not limited to a line structure. The common region to data line read can also provide read power reduction, because the unselected pillars are floating in the read. In addition, because the unselected pillars are floating, a reduction in the ratio of read time to program time, tR/tPROG, may be obtained. Such an architecture and read scheme can be implemented without an increase in the number of high voltage (HV)-driver transistors, so that little if any additional layout area is needed relative to the layout area for a conventional memory architecture and read scheme.

The programming page order may be the same as the conventional scheme from a source line to a bitline. However, in the case of the common region to data line read, the cell current flows in the opposite direction as a conventional read. The cell current is influenced by the data pattern after the data line side cells are programmed. To overcome the data pattern influence of the common region to data line read scheme, the program cell order can also be reversed from the conventional order, to proceed from the data line side to the common region side.

In various embodiments, as taught herein, a reverse sensing method can be used for the program verify and read modes of operation. Such reverse sensing methods can include selected and unselected access line biasing (for example, word line biasing) that allows for read/verify of individual cells in a 3D NAND string. Selected and unselected SGD biasing can allow for appropriate read bias of the selected SGD while allowing the channel of all pillars associated with the unselected SGD's to couple with the applied access line bias (for example, word line bias) to a higher potential. Such methods may effectively limit the selected and unselected access line (for example, word line) capacitance by eliminating the access line to channel capacitive component associated with unselected SGD's within the selected block. Such methods may effectively limit the read disturb stress seen by cells in unselected SGD's within the selected block of a 3D memory by reducing the gate electric field during read/verify.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A method of operating a memory, the method comprising:
   selecting a block of a three-dimensional memory, a string of a plurality of strings in the selected block, and a memory cell of the selected string, and
   reading a logic level in the selected memory cell by sensing the logic level in response to a read current flowing from a common region through the selected string to a data line with the common region at a higher voltage than the data line.

2. The method of claim 1, wherein the method includes precharging channels of each string of the plurality of strings in the selected block to read the logic level in the selected memory cell and, after precharging, applying read related signals such that a transistor, in each unselected string that couples the unselected string to the common region, is rendered non-conductive.

3. The method of claim 1, wherein the method includes using supply voltages Vcc and Vss, Vcc>Vss, in a precharging of the plurality of strings and in the reading of the logic level in the selected memory cell such that Vcc is applied to the common region during the precharging and during the reading, and Vss is applied to the common region after the reading.

4. The method of claim 1, wherein the method includes conducting a precharge followed by the reading of the logic level in the selected memory cell by applying a precharge voltage, Vpre, to the data line during the precharge and applying a supply voltage, Vcc, to the common region during the precharge, Vcc>Vpre.

5. The method of claim 1, wherein the method includes conducting operation of a three-dimensional memory having the plurality of strings equal 16 strings and having 32 tiers of control gate lines, each control gate line of each tier coupled to a respective control gate in each of the 16 strings.

6. A method of operating a memory, the method comprising:
   precharging channels of each string of a plurality of strings in a selected block of a three-dimensional memory from a common region to each string of the plurality of strings;
   applying a pass_read voltage to unselected control gates of the plurality of strings; and applying a read voltage to a selected control gate of a selected string of the plurality of strings while applying the pass_read voltage to the unselected control gates such that voltage of channels of unselected strings are boosted and read current flows from the common region through channels of the selected string to a data line with the common region at a higher voltage than the data line.

7. The method of claim 6, wherein precharging includes applying a voltage to the unselected control gates, the selected control gate, and the common region at a level greater than a voltage level applied to the data line for precharging.

8. The method of claim 7, wherein applying the voltage to the unselected control gates, the selected control gate, and the common region includes applying supply voltage Vcc to the unselected control gates, the selected control gate, and the common region with supply voltage Vss or a precharge voltage applied to the data line, Vcc being greater than Vss and greater than the precharge voltage.

9. The method of claim 6, wherein the method includes reading a logic one at the data line having a voltage higher than voltage at the data line reading a logic zero.

10. The method of claim 6, wherein the method includes programming memory cells of a string of the plurality of strings in a program cell order from the data line to the common region.

11. An apparatus comprising:
a three-dimensional memory having a block of memory cells;
a plurality of strings in the block arranged with each string of the plurality of strings coupled to a data line and to a common region, each string including a plurality of memory cell transistors, each memory cell transistor having a control gate and a channel, each string coupled to the data line individually by a select transistor and each string individually coupled to the common region by a source select transistor;
control circuitry to operatively apply read related signals to the plurality of strings such that a string of the plurality of strings is operatively selected and a memory cell of the selected string is operatively selected to read the selected memory cell; and
a sense amplifier configured to read a logic level in the selected memory cell in response to a read current flowing from the common region through the selected string to the data line with the common region at a higher voltage than the data line.

12. The apparatus of claim 11, wherein the control circuitry is structured to operatively precharge channels of each string of the plurality of strings in the block to read the logic level in the selected memory cell and, after the precharge, to apply the read related signals such that the source select transistor in each unselected string is rendered non-conductive.

13. The apparatus of claim 11, wherein the control circuitry is structured to apply a supply voltage Vcc to the common region during a precharge of the plurality of strings and during the read of the selected memory cell, and to apply a supply voltage Vss to the common region after the read, Vcc>Vss.

14. The apparatus of claim 13, wherein the control circuitry is structured to apply a precharge voltage, Vpre, to the data line during the precharge.

15. The apparatus of claim 11, wherein the data line is coupled to a low supply voltage, Vss, by an n-type metal oxide semiconductor load transistor.

16. The apparatus of claim 11, wherein the apparatus includes a verify circuit for each memory cell, the verify circuit having a node at the output of a flip-flop coupled to a load transistor disposed in a path to the input of the flip-flop.

17. An apparatus comprising:
a three-dimensional memory having a block of memory cells;
a plurality of strings in the block arranged with each string of the plurality of strings coupled to a data line and to a common region, each string including a plurality of memory cell transistors, each memory cell transistor having a control gate and a channel, each string coupled to the data line individually by a select transistor and each string individually coupled to the common region by a source select transistor;
control circuitry structured to operatively select a string of the plurality of strings and select a memory cell via the control gate of the selected memory cell in the selected string, to operatively precharge channels of each string of the plurality of strings in the block from the common region, to apply a pass_read voltage to unselected control gates of the plurality of strings, and to operatively apply a read voltage to the selected control gate during application of the pass_read voltage to the unselected control gates such that voltage of channels of unselected strings are boosted and read current flows from the common region through channels of the selected string to the data line; and
a sense amplifier configured to read a logic level in the selected memory cell in response to the read current flowing from the common region through the selected string to the data line with the common region at a higher voltage than the data line.

18. The apparatus of claim 17, wherein the control circuitry is structured to conduct the precharge by application of a voltage to the unselected control gates, the selected control gate, and the common region at a level greater than a voltage level applied to the data line in the precharge.

19. The apparatus of claim 18, wherein the data line is coupled to ground.

20. The apparatus of claim 18, wherein the three-dimensional memory is a three-dimensional NAND flash memory.

21. The apparatus of claim 17, wherein the control circuitry includes logic to program memory cells of a string of the plurality of strings in a program cell order from the data line to the common region.

22. A wafer comprising:
a plurality of dies, each die including
a three-dimensional memory having a block of memory cells;
a plurality of strings in the block arranged with each string of the plurality of strings coupled to a data line and to a common region, each string including a plurality of memory cell transistors, each memory cell transistor having a control gate and a channel, each string coupled to the data line individually by a select transistor and each string individually coupled to the common region by a source select transistor;
control circuitry to operatively apply read related signals to the plurality of strings such that a string of the plurality of strings is operatively selected and a memory cell of the selected string is operatively selected to read the selected memory cell; and
a sense amplifier configured to read a logic level in the selected memory cell in response to a read current flowing from the common region through the selected string to the data line with the common region at a higher voltage than the data line.

23. The wafer of claim 22, wherein the control circuitry of each die is structured to operatively precharge channels of each string of the plurality of strings in the block to read the logic level in the selected memory cell and, after the precharge, to apply the read related signals such that the source select transistor in each unselected string is rendered non-conductive.

24. The wafer of claim 22, wherein the control circuitry of each die is structured to apply a first voltage to the common region during a precharge of the plurality of strings and during the read of the selected memory cell, and to apply a precharge voltage to the data line during the precharge, the first voltage greater than the precharge voltage.

25. The wafer of claim 22, wherein the data line of each die is coupled, by an n-type metal oxide semiconductor load transistor, to a node that operatively receives a low supply voltage, Vss.

26. The wafer of claim 22, wherein the control circuitry of each die includes logic to program memory cells of a string of the plurality of strings in a program cell order from the data line to the common region.

\* \* \* \* \*